(12) United States Patent
Rhode et al.

(10) Patent No.: US 6,522,278 B1
(45) Date of Patent: Feb. 18, 2003

(54) DIGITAL-TO-ANALOG CONVERTER WITH POWER UP/DOWN TRANSIENT SUPPRESSION AND AUTOMATIC RATE SWITCHING

(75) Inventors: Jason P. Rhode, Austin, TX (US); Johann G. Gaboriau, Austin, TX (US); Xiaofan Fei, Austin, TX (US)

(73) Assignee: Cirrus Logic, Inc., Austin, TX (US)

( * ) Notice: Subject to any disclaimer, the term of this patent is extended or adjusted under 35 U.S.C. 154(b) by 0 days.

(21) Appl. No.: 10/078,824

(22) Filed: Feb. 19, 2002

Related U.S. Application Data

(60) Continuation-in-part of application No. 09/908,672, filed on Jul. 18, 2001, which is a division of application No. 08/941,566, filed on Sep. 30, 1997, now Pat. No. 6,281,821.

(51) Int. Cl.[7] ............................................. H03M 1/66
(52) U.S. Cl. ..................... 341/144; 341/143; 341/118
(58) Field of Search ............................ 341/144, 120, 341/118, 135, 143; 381/94.1, 94.4; 327/309, 321, 322

(56) References Cited

U.S. PATENT DOCUMENTS

| 4,901,215 A | * | 2/1990 | Martin-Lopez | 363/21.05 |
| 5,757,214 A | * | 5/1998 | Stoddard et al. | 323/282 |
| 5,936,446 A | * | 8/1999 | Lee | 327/108 |
| 2002/0105377 A1 | * | 8/2002 | Masuda et al. | 330/10 |

* cited by examiner

Primary Examiner—Peguy JeanPierre
(74) Attorney, Agent, or Firm—Blakely Sokoloff Taylor & Zafman LLP

(57) ABSTRACT

Power-up and power-down transient suppression are provided for an audio digital-to-analog converter with a single ended output to prevent annoying pops which accompany switching an audio system on and off. Power-up suppression is achieved by driving the output of a pulse-width circuit to a reference level such as around, and driving the pulse-width circuit gradually to its quiescent (zero signal) value. Power-down suppression is provided by using a positive feedback amplifier to accelerate current drain initiated by a constant current source used to bleed off the charge on output capacitor. The techniques disclosed apply readily to the outputs received from CDs, CD-ROMs, DAT and other digital recording media.

17 Claims, 15 Drawing Sheets

| LRCK (kHz) | MCLK (MHz) | | | | | |
|---|---|---|---|---|---|---|
| | HRM | | | BRM | | |
| | 128x | 192x | 256x | 384x | 512x | |
| 32 | 4.0960 | 6.1440 | 8.1920 | 12.2880 | 16.3840 | |
| 44.1 | 5.6448 | 8.4672 | 11.2896 | 16.9344 | 22.5792 | |
| 48 | 6.1440 | 9.2160 | 12.2880 | 18.4320 | 24.5760 | |
| 64 | 8.1920 | 12.2880 | N/A | N/A | N/A | |
| 88.2 | 11.2896 | 16.9344 | N/A | N/A | N/A | |
| 96 | 12.2880 | 18.4320 | N/A | N/A | N/A | |

FIG. 4

DIGITAL-TO-ANALOG CONVERTER WITH POWER UP/DOWN TRANSIENT SUPPRESSION AND AUTOMATIC RATE SWITCHING

CROSS-REFERENCE TO RELATED APPLICATIONS

This application is a Continuation-In-Part of application Ser. No. 09/908,672, filed Jul. 18, 2001, and entitled DIGITAL-TO-ANALOG CONVERTER WITH POWER UP/DOWN TRANSIENT SUPPRESSION AND AUTOMATIC RATE SWITCHING, which is a divisional of application Ser. No. 08/941,566, filed Sep. 30, 1997, and entitled DIGITAL-TO-ANALOG CONVERTER WITH POWER UP/DOWN TRANSIENT SUPPRESSION AND AUTOMATIC RATE SWITCHING (Now U.S. Pat. No. 6,281,821).

BACKGROUND OF THE INVENTION

1. Field of the Invention

The invention relates to digital-to-analog converters (DACs) and, more particularly, to switched capacitor digital-to-analog converters with power-up/down transient suppression for use in audio systems.

2. Description of Related Art

A number of digital sources of audio information are known. These include compact disk players, digital audio tape, digital transmissions and, similar devices. Stereo digital-to-analog converters are also known, which convert the output from such digital sources into analog information for playback. It is common, when dealing with such stereo digital-to-analog converters, that they have a single-ended output ranging between a ground or return value and a supply voltage level with a nominal or quiescent value, $V_q$, when no signal is applied. It is common in single-ended output systems to use a D.C. blocking capacitor to provide a ground-centered signal for subsequent processing.

Single-ended circuits powered from a single supply can suffer from large transient signals appearing at the outputs when initially powered on. Such DACs present an analog output centered on a nominal quiescent operating voltage, $V_q$. The transient occurs when power is applied to the part, and the analog outputs are required to move from a reference level such as ground to $V_q$. If this transient occurs rapidly, it can be approximated as a step function, which has energy at all frequencies. On power-up, such a system can suffer an annoying "POP" at the speaker as the DAC initially charges the D.C. blocking capacitor to $V_q$.

A similar click or pop can occur when the system is powered off. On entering the power-down state, the charge on the D.C. blocking capacitor remains. When power is removed, the residual charge on the D.C. blocking capacitor discharges rapidly across the load resister resulting in a loud pop. It would, therefore, be desirable to devise an improved method and apparatus for suppressing such transients in a digital audio device.

SUMMARY OF THE INVENTION

In accordance with the invention, electrical circuits provide power-up pop/click transient suppression utilizing a control circuit which operates to replace the pop or click, which would otherwise occur, with a smooth transition.

In accordance with another aspect of the invention, a digital to analog converter suppresses a pop or a click, which would otherwise occur when the DAC is powered down using a current source and a positive feedback amplifier.

Transient signals, and in particular transient signals from DACs using pulse-width modulators that cause audible clicks or pops can be reduced or eliminated by an circuitry that allows the modulator to produce a logic low output signal for some specified period of time during, for example, start up of the device.

Accordingly, one aspect of the present invention provides a transient suppression apparatus. The transient suppression apparatus includes a single-ended AC-coupled output stage, a pulse-width modulated driver and a control circuit. The single-ended AC-coupled output stage drives a load. The pulse-width modulated driver provides output to said single-ended output stage. The control circuit is for setting the output of the driver to produce an output substantially equal to a reference potential found on one side of the load and for gradually adjusting the driver to a nominal operating output thereafter.

Another aspect of the present invention provides a method providing transient suppression. In the method, a pulse-width modulated circuit to produces an output substantially equal to a reference potential found on one side of a load at power up and for gradually adjusting said pulse-width modulated circuit to a nominal operating output thereafter.

Still another aspect of the present invention provides an integrated circuit including a single-ended AC-coupled output stage, a pulse-width modulated driver and a control circuit. The single-ended AC-coupled output stage drives a load. The pulse-width modulated driver provides output to said single-ended output stage. The control circuit is for setting the output of the driver to produce an output substantially equal to a reference potential found on one side of the load and for gradually adjusting the driver to a nominal operating output thereafter.

Yet another aspect of the present invention provides an apparatus including a source of one or more channels of audio information, a digital-to-analog converter, a transient suppression apparatus, and an output system. The digital-to-analog converter converts digital audio information from the source into one or more channels of analog information and includes a pulse-width modulated driver. The transient suppression apparatus has a control circuit for setting the output of the pulse-width modulated driver to produce an output substantially equal to a reference potential for a load and for gradually adjusting the driver to a nominal operating output thereafter. The output system produces audible representations of the one or more channels of audio information.

The above as well as additional objectives, features, and advantages of the present invention will become apparent in the following detailed written description.

BRIEF DESCRIPTION OF THE DRAWINGS

The objects, features and advantages of the system of the present invention will be apparent from the following description in which:

FIG. 4 is a table showing exemplary relationships between MCLK and LRCK as a function of sample rate and mode.

DESCRIPTION OF THE PREFERRED EMBODIMENT

Figure 1:
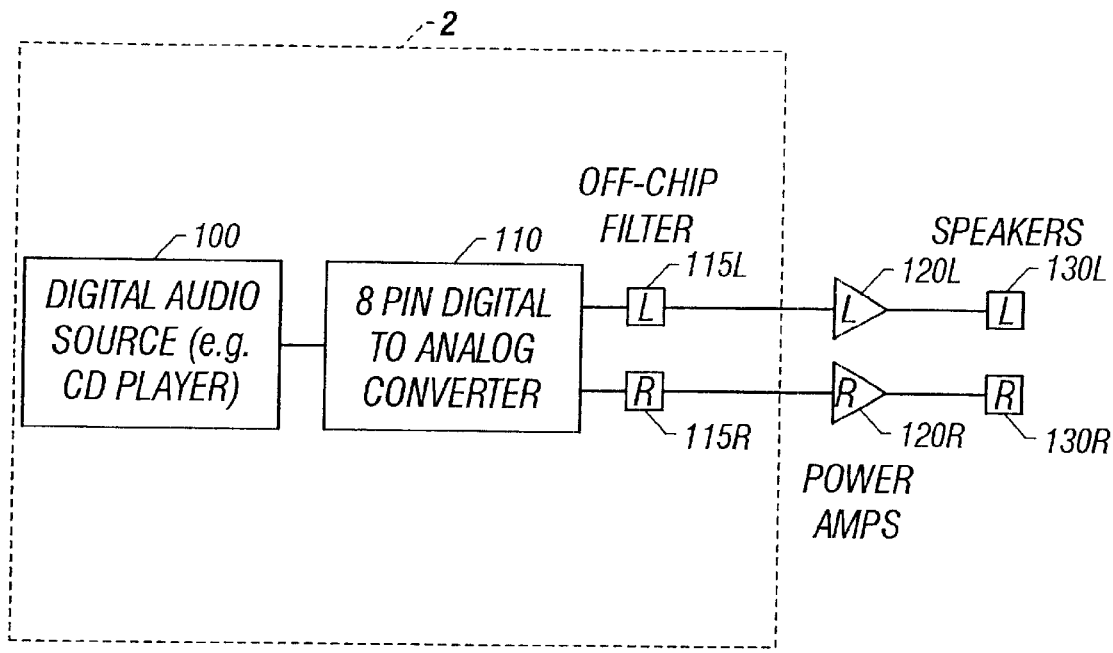
FIG. 1 is a block diagram of an exemplary stereo system using a digital-to-analog converter in accordance with one embodiment of the invention.

FIG. 1 is a block diagram of an exemplary stereo system using a digital-to-analog converter in accordance with one embodiment of the invention.

A digital audio source, such as a CD player or digital audio tape player provides output signals to an eight pin digital-to-analog converter 110 where the digital signals from the digital audio source 100 are converted into respective analog outputs, one for a left channel and one for a right channel, which are respectively fed to off-chip filters 115L and 115R. The output of those filters are fed to power amplifiers 120L and 120R respectively and from their to respective speakers 130L and 130R for reproduction for listening. The portion of the circuitry shown in the dashed box in FIG. 1 is illustrated in more detail in FIG. 2.

Figure 2:
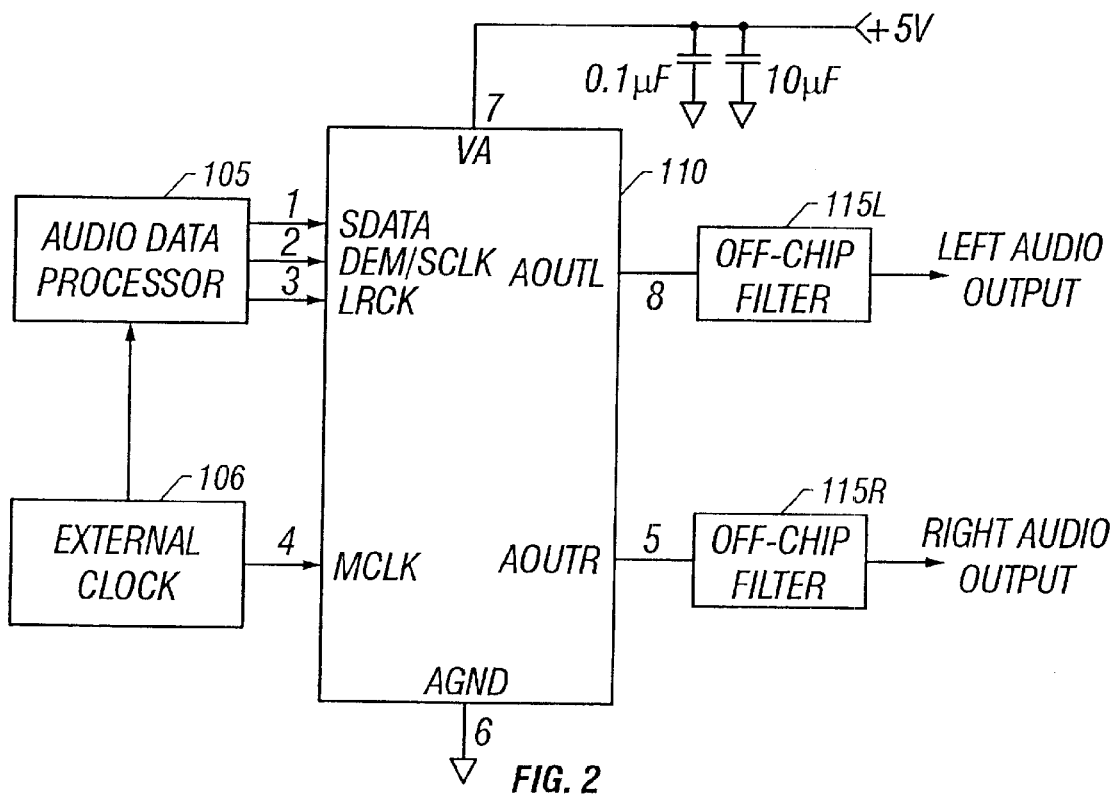
FIG. 2 is a block diagram showing a portion of the system of FIG. 1 including an exemplary eight pin digital-to-analog converter in more detail.

Referring to FIG. 2, the eight pin digital-to-analog converter 110 and the off-chip filters 115L and 115R correspond to the same components shown in FIG. 1. The audio data processor 105 is part of digital audio source 100 shown in FIG. 1. The external clock 106 is similarly provided from the digital audio source 100 in this particular implementation. An external clock can, of course, be provided separately. The audio data processor 105 provides three signals to the eight pin digital-to-analog converter 110. The SDATA signal coming in on pin 1 from the audio data processor 105 constitutes the actual sample values to be reproduced at the audio outputs.

Pin 2 receives one of two signals from the audio data processor 105. If an external serial clock (SCLK) signal is utilized, it is applied to pin 2 and used to write the serial data (SDATA) signals into a receiving buffer. If an external SCLK signal is not received over pin 2, an SCLK signal will be generated internally. If pin 2 is not utilized for an SCLK signal, then it may be utilized for switching in or out a de-emphasis circuit selectively utilized to improve signal to noise ratio.

The left-right clock (LRCK) comes in over pin 3. The LRCK alternates between an indication that the SIDATA belongs to the left channel and that SDATA belongs to the right channel. This signal is utilized to route incoming data to the proper channel. The master clock (MCLK) comes in over pin 4 of the digital-to-analog converter 110 and pin 7 receives a capacitor smoothed power supply. The power return or ground connects over pin 6. Pins 8 and 5 constitute the left and right audio output signals AOUTL and AOUTR, respectively. The signals on pins a and 5 are filtered by off-chip filters 115 L and 115 R, respectively from which the left audio output and right audio output are taken.

Figure 3A:
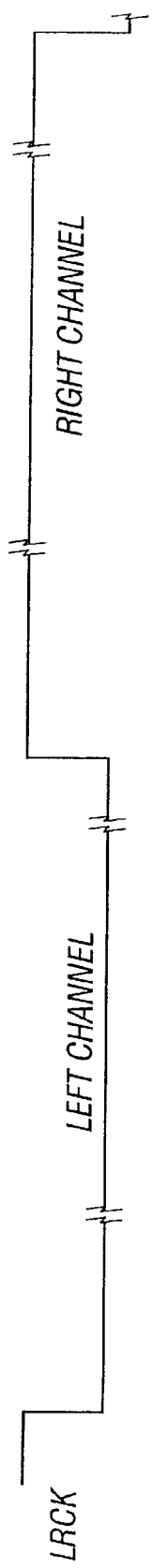
FIGS. 3A–3C collectively represents a timing diagram showing an exemplary relationship between LRCK and SCLK and one arrangement of SDATA.
Figure 3B:
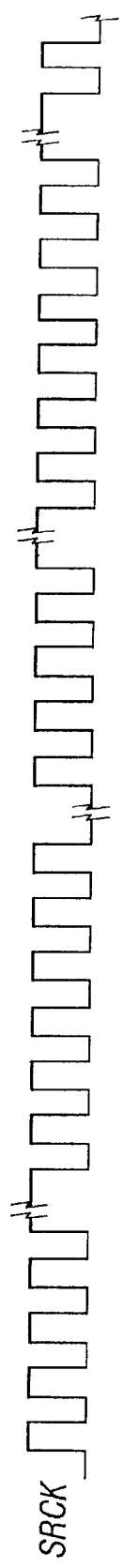
Figure 3C:
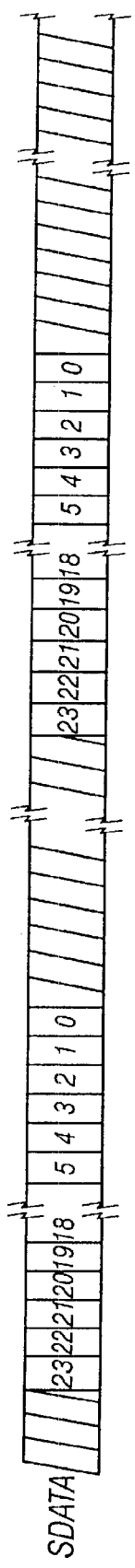

FIGS. 3A–3C collectively represent a timing diagram showing an exemplary relationship between LRCK and SCLK and one arrangement of SDATA. The LRCK is shown in FIG. 3A. It alternates between a state indicating the left channel and a state indicating the right channel on a regular basis. FIG. 3B shows the SCLK data utilized to receive the SDATA. FIG. 3C illustrates two 24-bit packets of SDATA information being received for the left and right channels, respectively. Notice that the number of bits that can be sent during a left channel or a right channel can be greater than the 24-bits shown.

A number of different formats for SDATA are possible. In the examples shown in FIG. 3C, the 24-bits of information from SDATA are shown to be left justified within the left channel and right channel windows, respectively. One common alternative format is to right justify the SIDATA information within the left and right channel windows. Whatever the particular alignment of the SDATA information within the left channel and right channel windows is, a digital-to-analog converter accommodates it.

FIG. 4 is a table showing exemplary relationships between MCLK and LRCK as a function of sample rate and mode. The switched capacitor digital-to-analog converter described herein accepts data at standard audio sampling rates including 48, 44.1 and 32 kHz in a base rate mode (BRM). Sampling rates of 96, 88.2 and 64 kHz can be accommodated in a high rate mode (ERM).

Audio data is input via the serial data input pin (SDATA) the left/right clock (LRCK) defines the channel and delineation of data and the serial clock (SCLK) clocks audio data into the input data buffer. Different versions of the chip can accommodate different serial data formats. The master clock (MCLK) is used to operate the digital interpolation filter and the delta sigma modulator.

MCLK must be either 256X, 384X or 512X the desired input sample rate in base rate mode and either 128X or 192X in high rate mode. The LRCK frequency is equal to $F_s$, the frequency at which words for each channel are input to the device. The MCLK-to-LRCK frequency ratio is detected automatically during the initialization sequence by counting the number of MCLK transitions during a single LRCK period and used to set the mode. FIG. 4 reflects several standard audio sample rates and the required MCLK and LRCK frequencies and illustrates the mode utilized to accommodate those.

The serial clock SCLK controls the shifting of data into in-out data buffers. Both external and internal serial clock generation modes are supported. Chip 110 will enter the external serial clock mode when 16 low to high transitions are detected on the DEM/SCLK pin during any phase of the LRCK period. When this mode is enabled, the internal serial clock mode and de-emphasis filter cannot be accessed. The chip will switch to internal serial clock mode if no low to high transitions is detected on the DEM/SCLK pin for two consecutive frames of LRCK.

Figure 5:
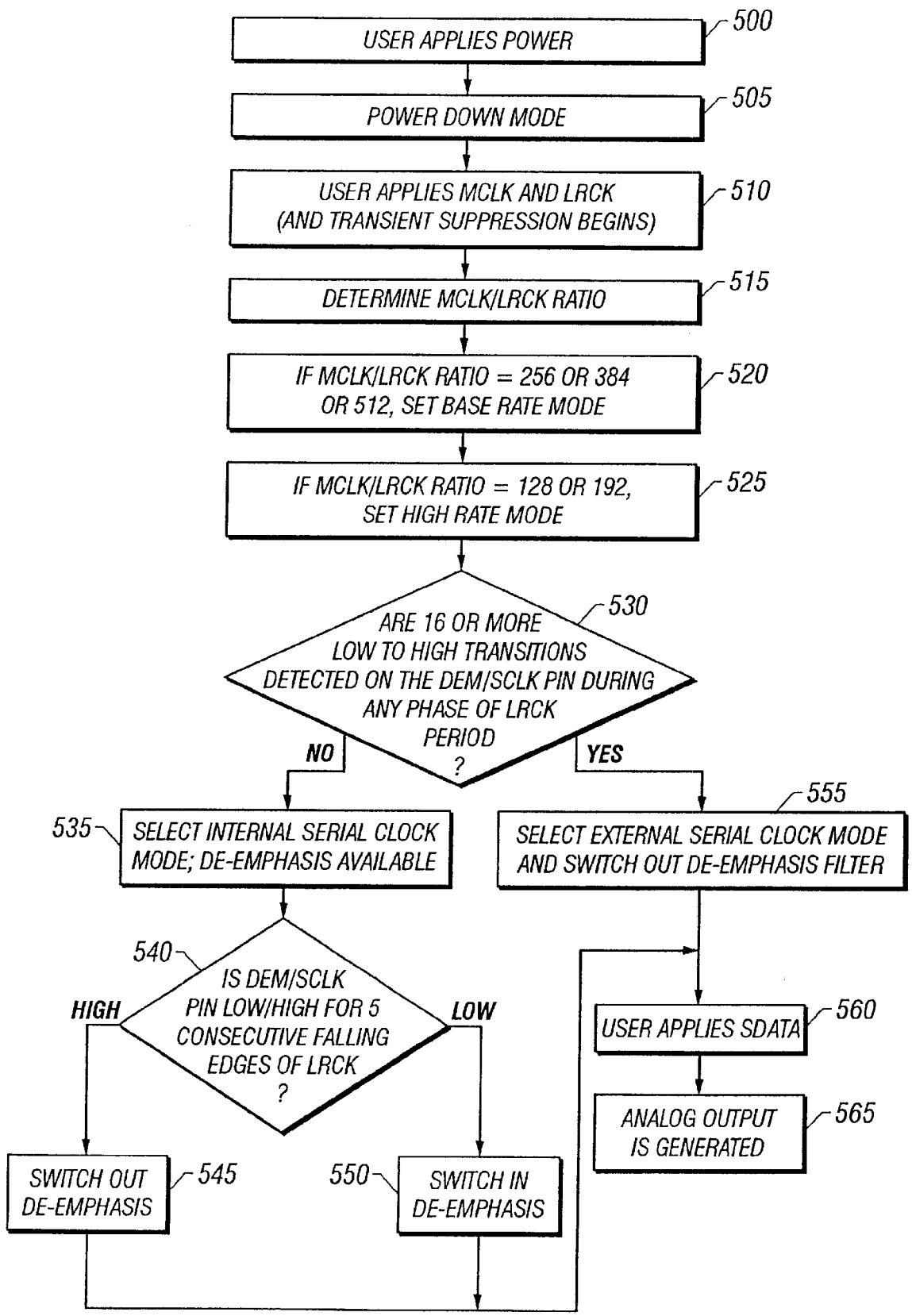
FIG. 5 is a flow chart showing an exemplary power-down sequence for an eight pin digital-to-analog converter shown in FIG. 2.

FIG. 5 is a flow chart showing an exemplary power-up sequence for an eight pin digital-to-analog converter 110 shown in FIG. 2. When the user applies external power 500, chip 110 enters the power-down mode 505. In the power-down state, power is still available to the chip, but the interpolation filters and delta sigma modulators are reset and the internal voltage reference, one bit switched capacitor digital-to-analog converters and low-pass filters are powered down. The chip 110 remains in the power down mode until MCLK and LRCK are present. Once MCLK and LRCK are detected, MCLK occurrences are counted over one LRCK period to determine the MCLK/LRCK frequency ratio. Power is then applied to the internal voltage reference (510) and transient suppression begins. Finally, power is applied to the IDAC's and switched capacitor filters and the analog outputs will ramp to the quiescent voltage $V_q$.

The ratio MCLK divided by LRCK (515) is used to determine mode. If the ratio equals 256 or 384 or 512, the base rate mode is selected (520). If the ratio is 128 or 192, high rate mode is selected (525). Either sequentially or simultaneously pin 2 of chip 110 is checked to determine whether 16 or more low to high transitions are detected on the DEM/SCLK pin during any Chase of an LRCK (530). If they are, external clock mode will be selected and access to the de-emphasis filter will not be permitted (555). If 16 or more low to High transitions are not detected during that interval (530-N), pin 2 will be assigned to activate or deactivate a de-emphasis filter in response to the logic state applied to pin 2, and the internal serial clock mode will be selected (535) thus freeing pin 2 for use in activating the de-emphasis filter.

Figure 6:
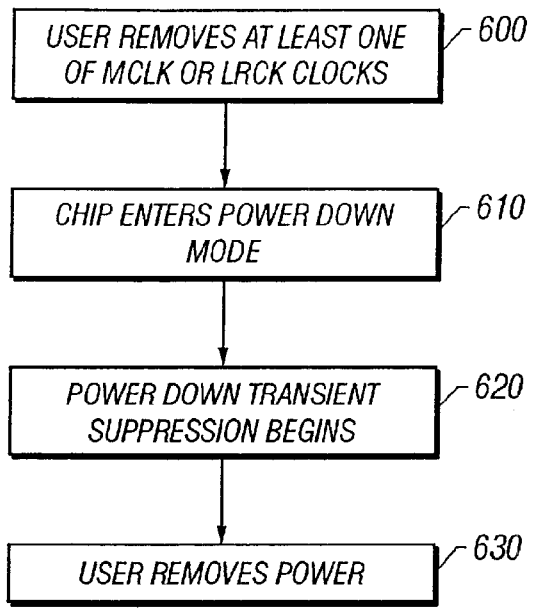
FIG. 6 is a flow chart showing an exemplary power-down sequence for an eight pin digital-to-analog converter shown in FIG. 2.

FIG. 6 is a flow chart showing an exemplary power-down sequence for an eight-pin digital-to-analog-converter as shown in FIG. 2. When the user removes at least one of MCLK or LRCK (600) the chip enters the power-down mode (610). At that time, power-down transient suppression begins as described more hereinafter (620). Finally, the user removes power completely (630) and the system shuts down.

Figure 7:
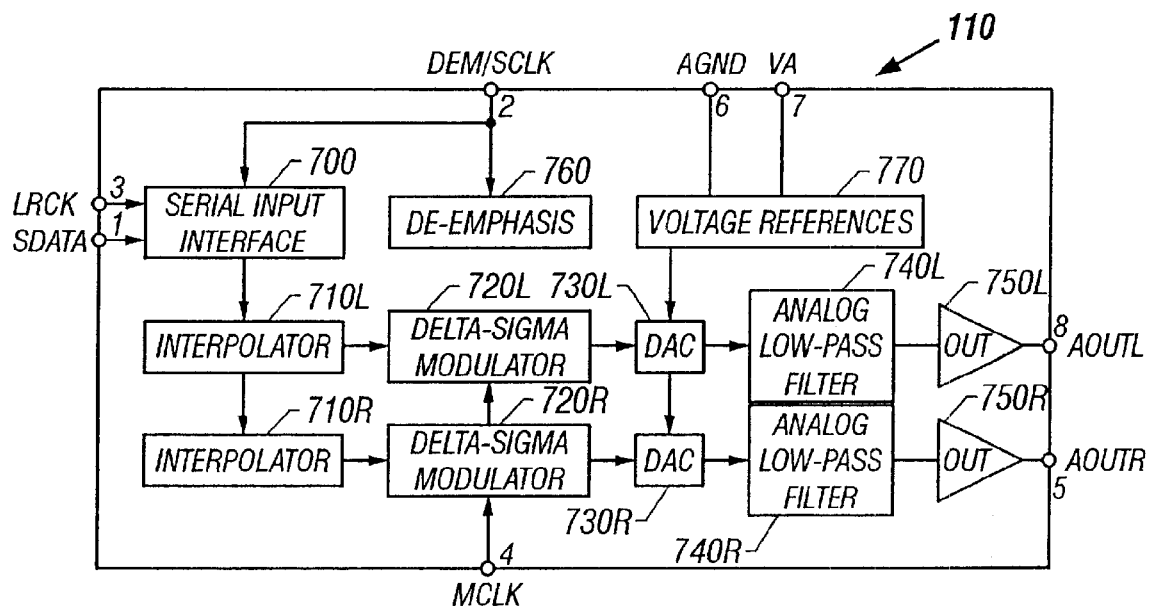
FIG. 7 is a block diagram of an exemplary eight pin digital-to-analog converter.

FIG. 7 is a block diagram showing an exemplary eight pin digital-to-analog converter in accordance with one embodiment of the invention. As shown in FIG. 7, the digital audio data (SIDATA) comes in over pin 1 and is applied to serial input interface 700. The input interface 700 also receives LRCK over pin 3 and uses LRCK to determine whether or not the SDATA arriving will be directed to interpolator 740L or 740R. If an external SCLK is utilized, it will arrive over pin 2 and be applied to the serial input interface 700 as shown. As shown in FIG. 7, there are two audio tracks, a left and right audio track. The left track consists of interpolator 710, delta sigma modulator 720L, switched capacitor digital-to-analog converter 730L, analog low-pass filter, 740 and optional amplifier 750L. The right track is substantially identical and the left and right channel devices are distinguished by an L suffix or an R suffix, respectively. The left-channel output AOUTL is provided at pin 8 of the chip. The right channel output AOUTR is provided at pin 5. If an external SCLK is not utilized, pin 2 of the chip is utilized to control the application of de-emphasis using block 760. Connections for de-emphasis are not shown in detail but are well known in the art. Pins 7 and 6 provide the power for the chip (VA) and the return (AGND), respectively. Supply voltage VA is utilized to provide voltage references (770) for DACs 730L and 730R.

Figure 8:
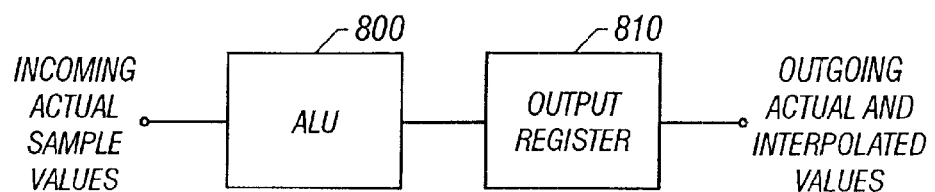
FIG. 8 is a block diagram showing an exemplary interpolator shown in FIG. 7.

FIG. 8 is a block diagram of an exemplary interpolator in accordance with the invention shown in FIG. 7. As shown in FIG. 8, an arithmetic logic unit (ALU) 800 receives the incoming actual sample values for the channel with which the interpolator is utilized. The ALU is associated with, either internally or externally, an output register 810. The interpolator provides a plurality of calculated intermediate samples in between each Input sample. A number of interpolation algorithms can be used. The actual and interpolated values are passed to the delta-sigma modulator.

Any of a number of different well-known circuits may be utilized for the delta-sigma modulator.

Figure 9:
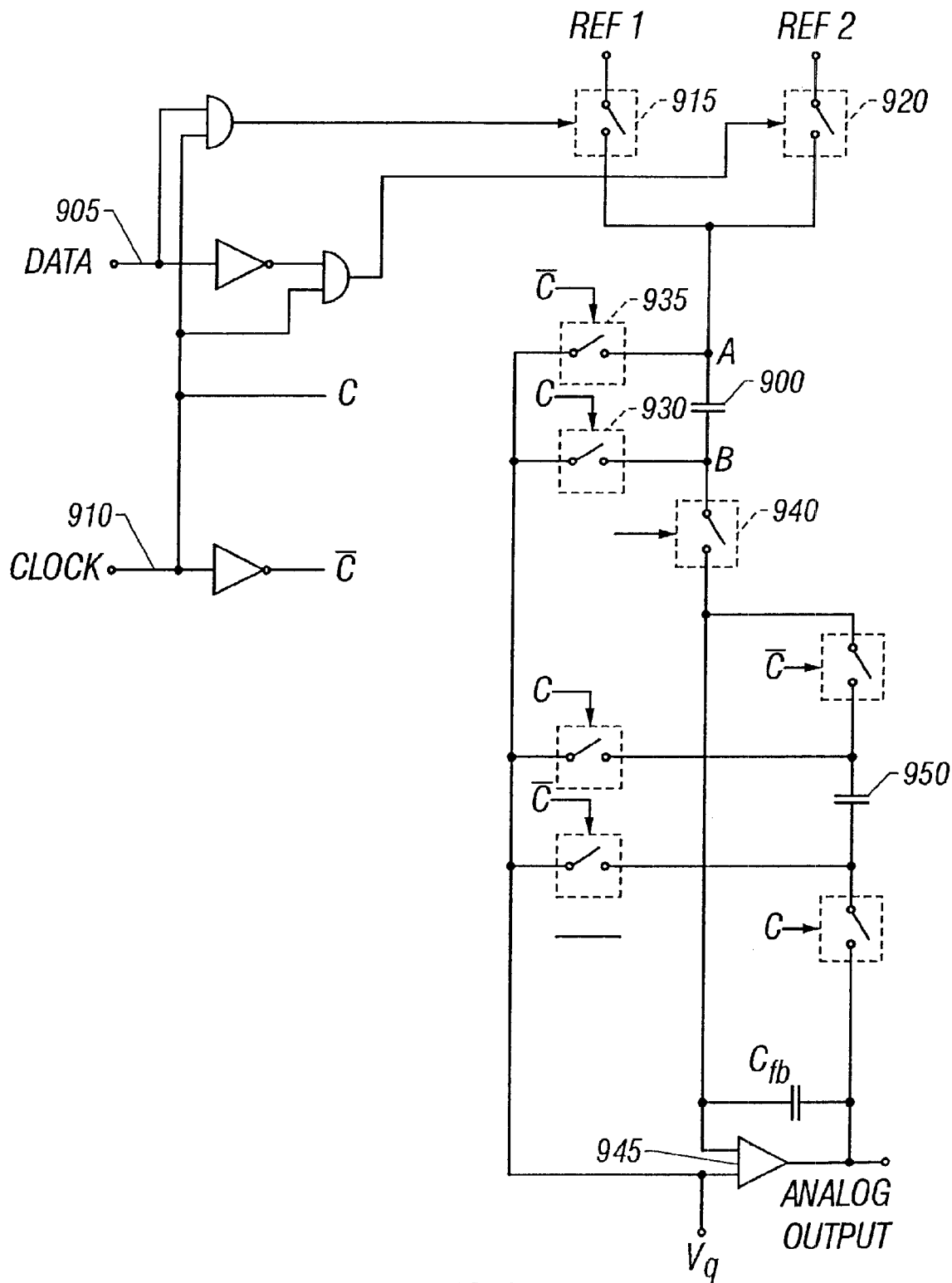
FIG. 9 is a block/schematic diagram of an exemplary switched capacitor digital-to-analog converter (DAC) shown in FIG. 7.

FIG. 9 is a block/schematic diagram of an exemplary DAC in accordance with the invention shown in FIG. 7. The DAC is, in a preferred form, a switched capacitor DAC. The DAC translates the bit data into a series of charge packets. The magnitude of the charge in each packet is determined by sampling of a voltage reference onto a switched capacitor 900, wherein the polarity of each packet is controlled by the one bit data (905). This technique greatly reduces the sensitivity to clock jitter and provides low-pass filtering of the output. Reference voltage 1 is connected to the switched capacity 900 over switch 915 when both data and clock are high or reference 2 is connected when data is low (and clock high). Thus, reference 1 and reference 2 are selectively applied to side A capacitor 900 depending on the logic state of data line 905, while side B of capacitor 900 is held at voltage level $V_q$ by switch 930. When clock 910 is low, the B-side of capacitor 900 is connected to one input of an integrating amplifier 945 by switch 940 and the charge is transferred to integrating capacitor $C_{fb}$. While side A of capacitor 900 is held at $V_q$ by switch 935. During one clock cycle, capacitor 950 removes a charge $Q=C_{950} \times V_{out}$ from $C_{fb}$. The charge is transferred to $C_{fb}$ by capacitor 900 is $Q=C_{900} \times V_{ref}$. Thus the DC gain of the switched capacitor filter $$\frac{C_{900}}{C_{950}}.$$

Figure 10:
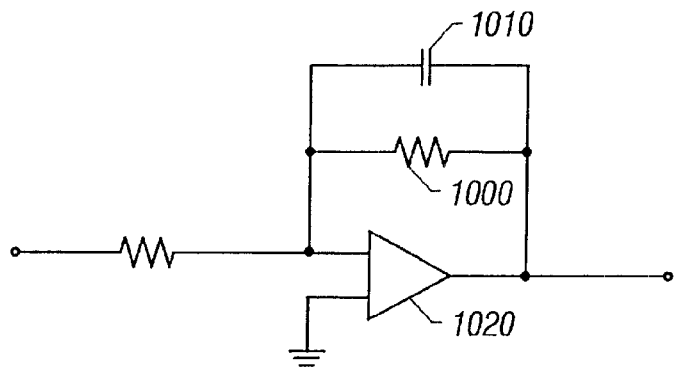
FIG. 10 is a schematic diagram of an exemplary analog low-pass filter and optional amplifier shown in FIG. 7.

FIG. 10 is a schematic diagram of an exemplary analog low-pass filter and optional amplifier in accordance with the invention shown in FIG. 7. As shown in FIG. 10, an analog low-pass filter consisting of resistor 1000 and capacitor 1010 is in the feedback path-from the output of amplifier 1020 to a summing junction input. This arrangement serves to smooth the output and attenuate out of band noise.

Figure 11:
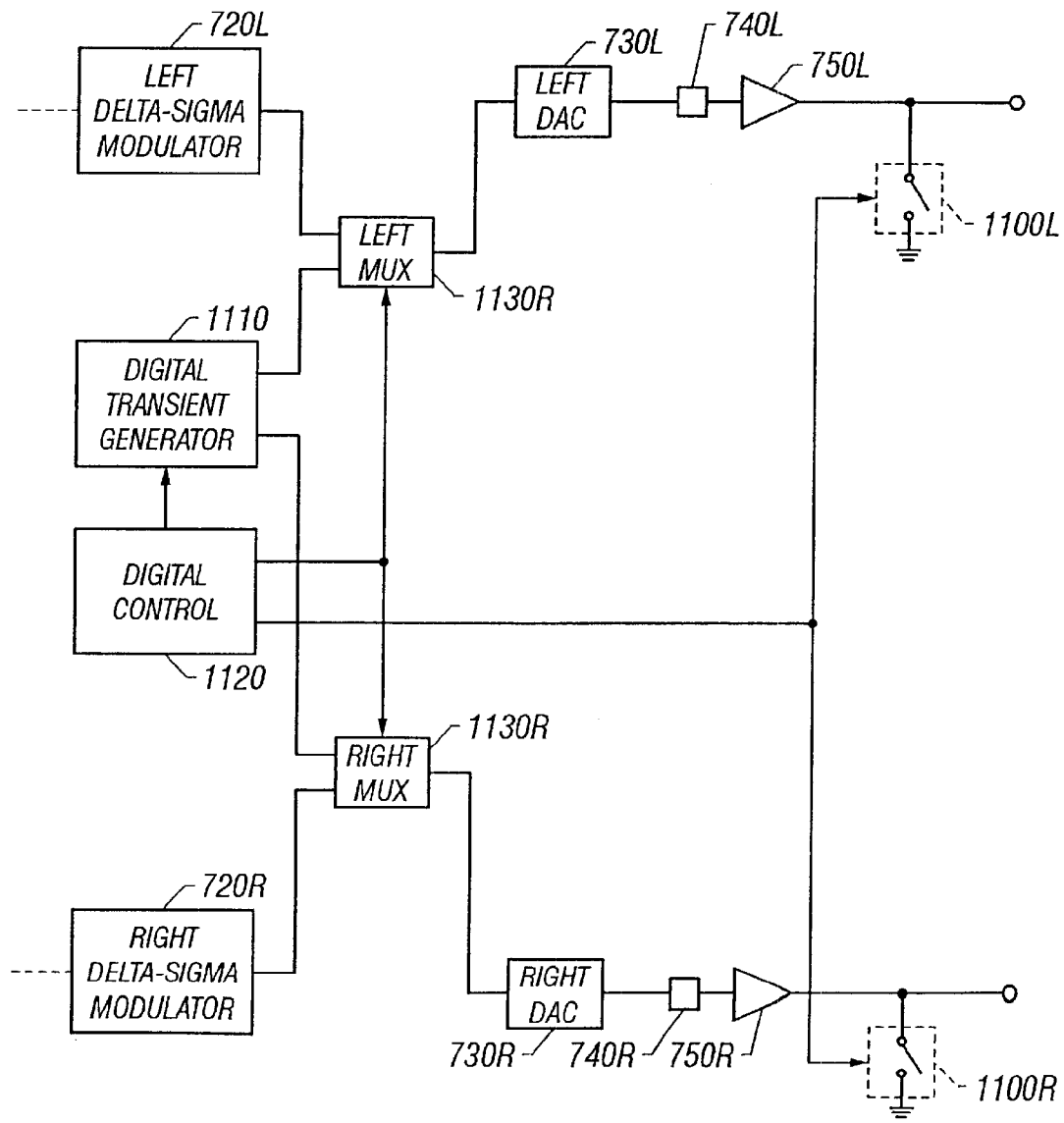
FIG. 11 is a block diagram of one embodiment of extensions to FIG. 7 to avoid a power-on transient pop.

FIG. 11 is a block diagram of one embodiment of extensions to FIG. 7 to avoid a power-on transient pop in accordance with the invention. Modulator 720, DAC 730, low-pass filter 740 and optional amplifier 750 for the left and right channels can be the corresponding items illustrated in FIG. 7. Note, however, that for purposes of Transient suppression, the modulators can be any type of modulator and the DACs can be any types of DAC. As shown in FIG. 11, an output clamp 1100 can be activated to place the output pins at a ground potential under control of digital control 1120. A digital transient generator 1110 is utilized to generate a replacement function for what would otherwise be a loud pop at the output. The generator 1110 starts with a value, preferably as close to ground as possible. This value is applied over the respective left and right multiplexers or selectors 1330L/1330R to a respective left or right DAC 730L/730R. This places the output of amplifiers 750L/750R as close to ground as possible. Thus, the clamps 1100 can be opened and there will be no signals to create a loud pop in the output of audio system. The digital transient generator 1110 then increases the value in a gradual manner from ground to $V_q$ thus readying the audio channels 720, 730, 740 and 750 to receive incoming signal. When the output of amplifier 750 is at $V_q$, the digital control 1320 switches the multiplexer/selector to apply the output of the delta-sigma modulator 720 to the DAC 730. As indicated above, if delta-sigma modulation is not utilized, the output of the digital transient generator will be in a format suitable for the modulation and DAC utilized.

Figure 12:
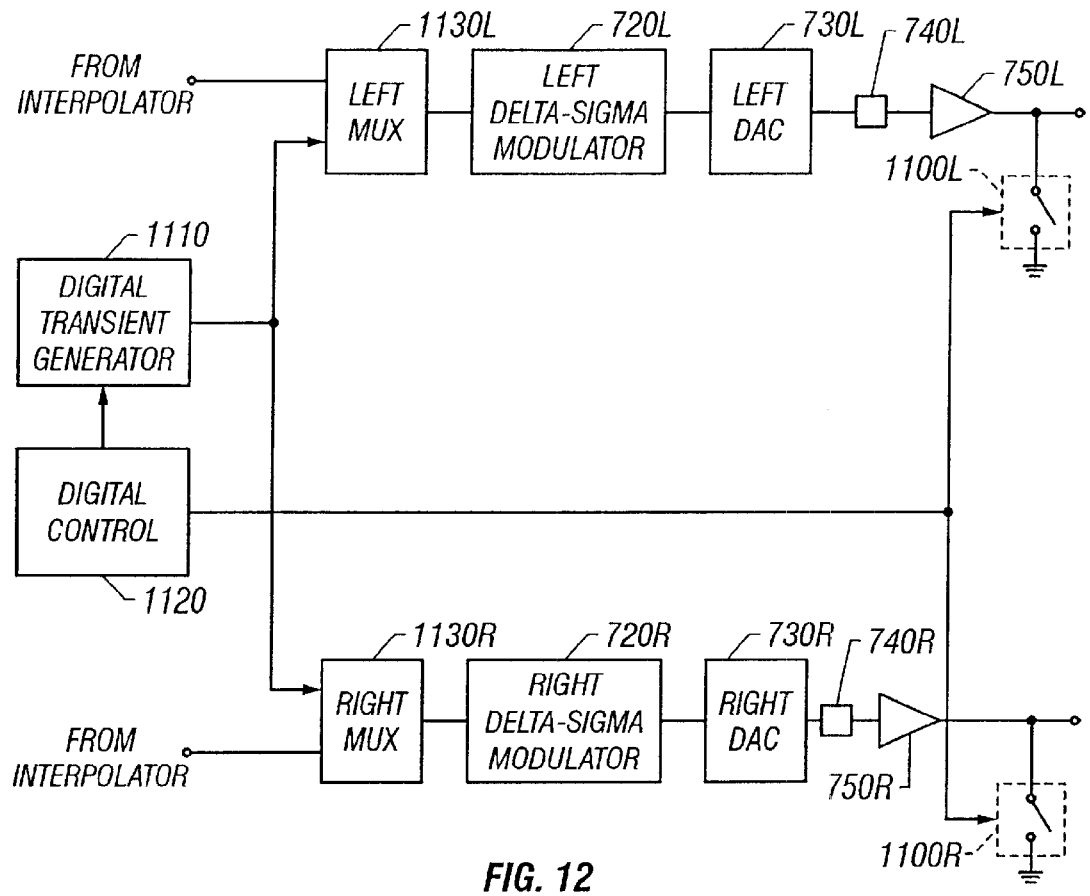
FIG. 12 is a block diagram of a second embodiment of extensions to FIG. 7 to avoid a power-on transient pop.

FIG. 12 is a block diagram of a second embodiment of extensions to FIG. 7 in accordance with the invention to avoid a power-on transient pop. The embodiment of FIG. 12 operates substantially identically to the circuit shown in FIG. 11, except that the output from the digital transient generator is inserted before the delta-sigma modulator 720, rather than after. Thus, the multiplexers are inserted between the interpolator and the delta sigma modulators rather than between the delta-sigma modulators and the DACs as shown in FIG. 11.

Figure 13:
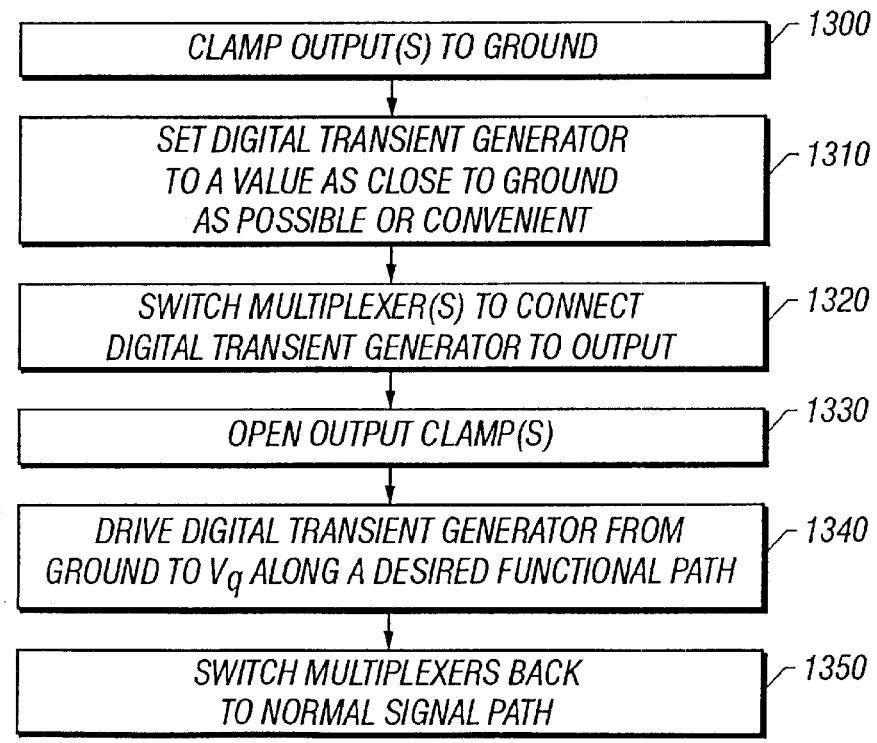
FIG. 13 is a flow chart of an exemplary process for operating the circuits of FIGS. 11 and 12.

FIG. 13 is an exemplary flow chart of a process for operating the circuits of FIGS. 11 and 12 in accordance with the invention. First, the digital control 1120 clamps the outputs to ground (1300). Then it sets the digital transient generator to a value as close to ground as possible or convenient (1310). The multiplexers are switched to connect the digital transient generator so that the digital transient generator produces a value at the output which approximates the ground potential to which the output is clamped (1320). Thus, with the output clamped to ground and the digital transient generator set to provide an output value equivalent to ground, when the output clamps are released (1330) there is no pop in the speakers or the output of the audio path. The digital transient generator can then be driven from ground to voltage $V_q$ along a desired functional path (1340) and the multiplexer switched back to the normal path (1350).

Figure 14:
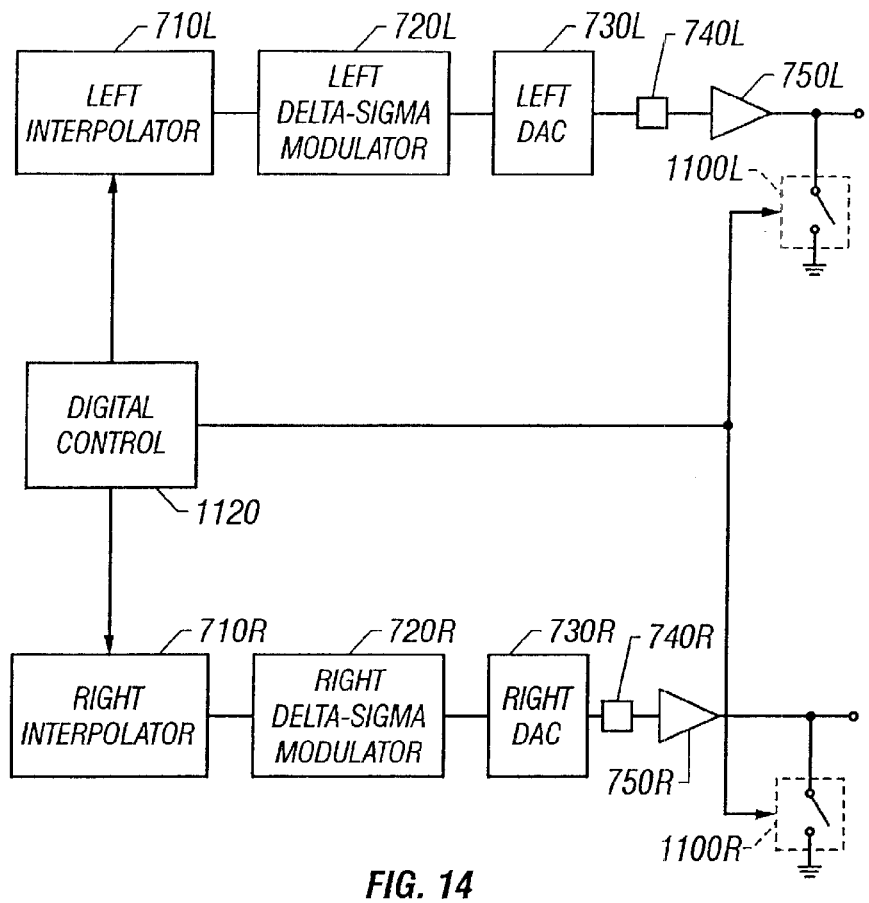
FIG. 14 is a block diagram of a preferred embodiment of extensions to FIG. 7 to avoid a power-on transient pop.

FIG. 14 is a block diagram of a preferred embodiment of extensions to FIG. 7 in accordance with the invention to avoid a power-on transient pop. In this embodiment, interpolators 710 are utilized to perform the function of digital transient generator 1110 shown in the other embodiments. As shown in FIG. 8, the preferred interpolator included an arithmetic logic unit 800 and an output register 810. The ALU 800 can do more than just calculate interpolated values. It can perform a variety of mathematical operations.

Figure 15:
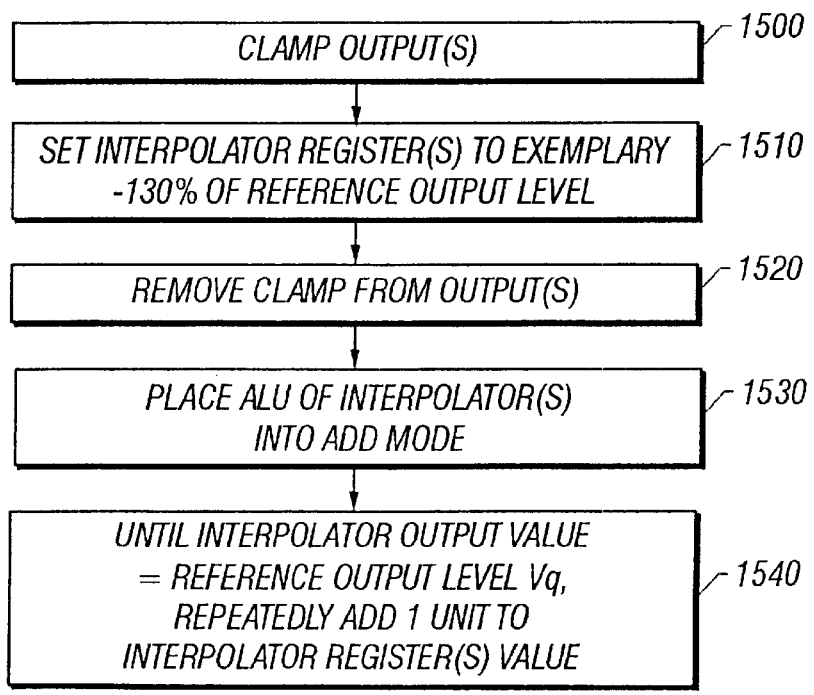
FIG. 15 is a flow chart of an exemplary process for operating the circuit of FIG. 14.

FIG. 15 is an exemplary flow of a process for operating the circuit of FIG. 14 in accordance with the invention utilizing the interpolator as a digital transient generator. As before, the digital control 1120 causes the outputs to be clamped to ground using switches 1100 (1700). The interpolator output register is then set to an exemplary −130% of the expected signal swing above or below $V_q$ (1510). This places the output of the interpolator as close to ground as possible. This results in the signal propagating through the audio channels being at approximately ground. Therefore, when the clamps are removed (1520), there will be no pop on the output. The ALU of the interpolator(s) is then placed into an add mode (1530) and a predetermined value (e.g. a unit-value) added repeatedly to the value in the out-put register until the output value equals the reference output level, $V_q$ (1540). In this way, the interpolator(s) function to bring the output level from ground to $V_q$ without the unpleasant pop of the prior art.

Figure 16:
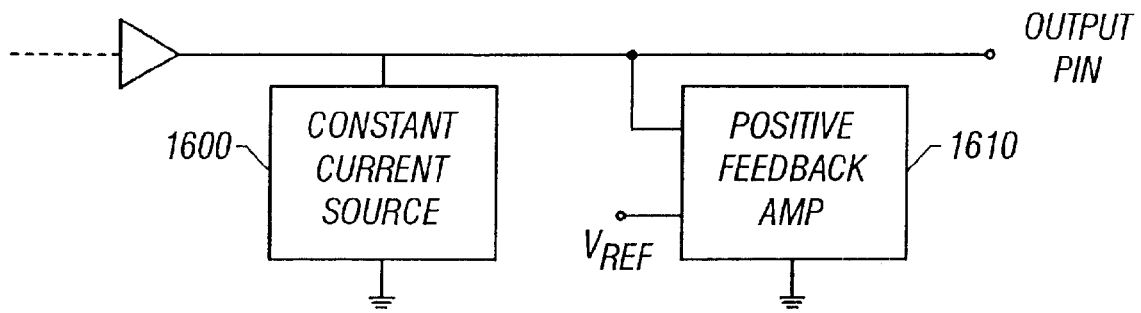
FIG. 16 is a block diagram of an exemplary extension to FIG. 7 to avoid a power-off transient pop.

FIG. 16 is a block diagram of an exemplary circuit used as an extension to FIG. 7 in accordance with the invention to avoid a power-off transient pop. FIG. 16 illustrates one embodiment of circuitry utilized to implement step 620 of the process shown in FIG. 6. As described previously, the output pins AOUTL and AOUTR, respectively pins 8 and 5, are set at a nominal $V_q$ upon power-up. Thus, the off-chip filters 115, shown in FIG. 2, are charged essentially to a nominal $V_q$ level. In the power-down state, the charge would normally remain on the off-chip filters 115 and until power was removed by turning off the device. The discharge from the off-chin filters on turn off can result in a pop analogous to that experienced during power-on. To avoid this, when the circuit enters the power-down state, a current driver, such as a constant current source (1600) begins draining current from the output pin to discharge the off-chip filter. The current drain could operate by itself to discharge the DC blocking capacitor. However it is preferred that the current drain work together with a supplemental circuit, such as the positive feedback amplifier 1810 shown, to accelerate the current flow begun by the current drain. It is not necessary that the supplemental, circuit have positive feedback, but it is desirable.

Figure 17:
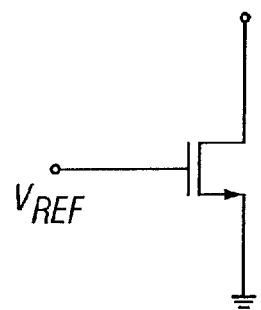
FIG. 17 is a schematic diagram of one implementation of a constant current source shown in FIG. 16.

FIG. 17 is a schematic diagram of an exemplary constant current source shown in FIG. 16 in accordance with the invention. Almost any constant current source will do. However, the FET shown in FIG. 17 is a convenient way to implement the source.

Figure 18A:
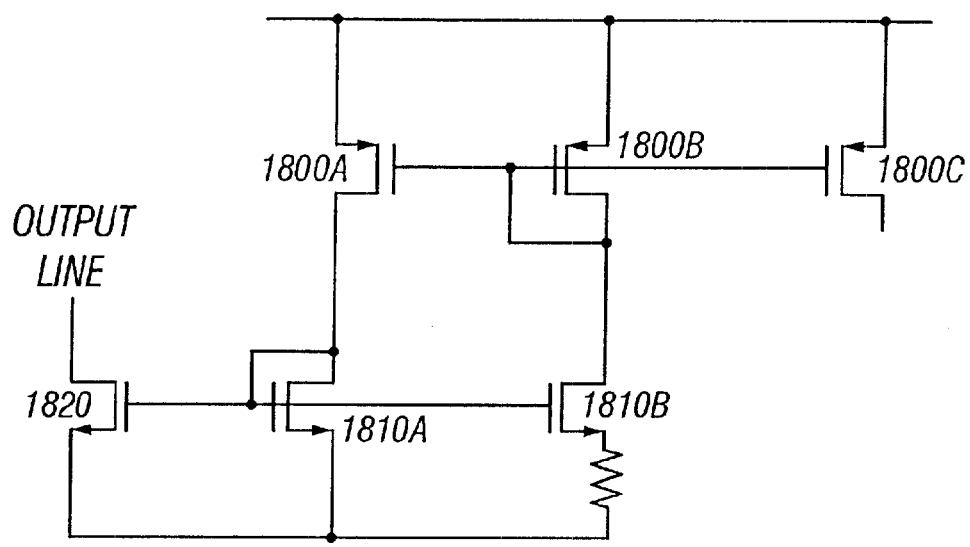
FIG. 18A is a schematic diagram of a preferred constant current source shown in FIG. 16.

FIG. 18A is a schematic diagram of a preferred constant current source shown in FIG. 16 in accordance with the invention. FETs 1800A, 18002, 1810A and 18103 form a reference current generator, which controls the current flowing in current drain 1820 to render it substantially constant.

Figure 18B:
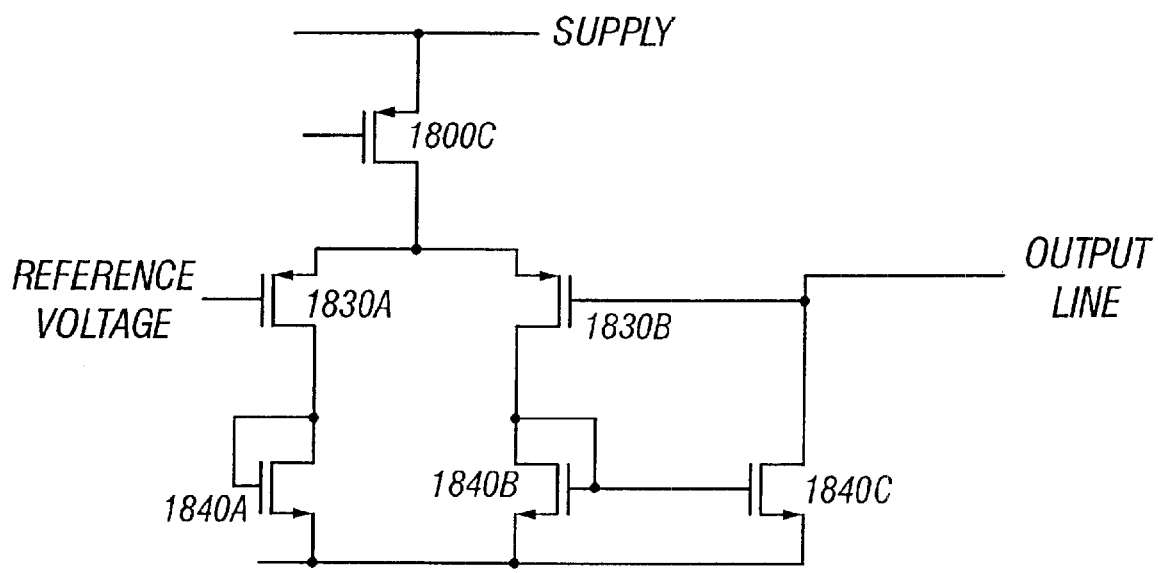
FIG. 18B is a schematic diagram of a preferred positive feedback amplifier shown in FIG. 16.

FIG. 18B is a schematic diagram of an exemplary preferred positive feedback amplifier shown in FIG. 16 in accordance with the invention. When the device is put into a power-down state, device 1820 begins discharging the large off-chip capacitor. This flow is reflected in device 1800C and used in 1830A, 18302, 1840A and 1840B to drive 1840C to accelerate the discharge. Thus, the output voltage decreases slowly at first, then accelerates due to positive feedback.

In addition to conventional delta-sigma DACs, it is also possible to create a DAC based on a pulse-width modulator (PWM). Pulse-width modulation techniques are known to those skilled in the art. The output of a pulse-width modulator is a digital signal that contains pulses at a fixed repetition rate where the width of each pulse is proportional to the input of the modulator. An exemplary pulse shape is shown in FIG. 19B. It is possible that with a full-scale positive input signal applied, the output of a pulse-width modulator could be a constant logic high signal. With a full-scale negative input signal, the output of a pulse-width modulator could be a constant logic low signal. ***Since the output signal is typically AC coupled to the load, the output signal will charge up to the signal common mode level. Therefore, the problems described in previous sections regarding how to charge AC coupling capacitor on start-up remains.

Figure 19A:
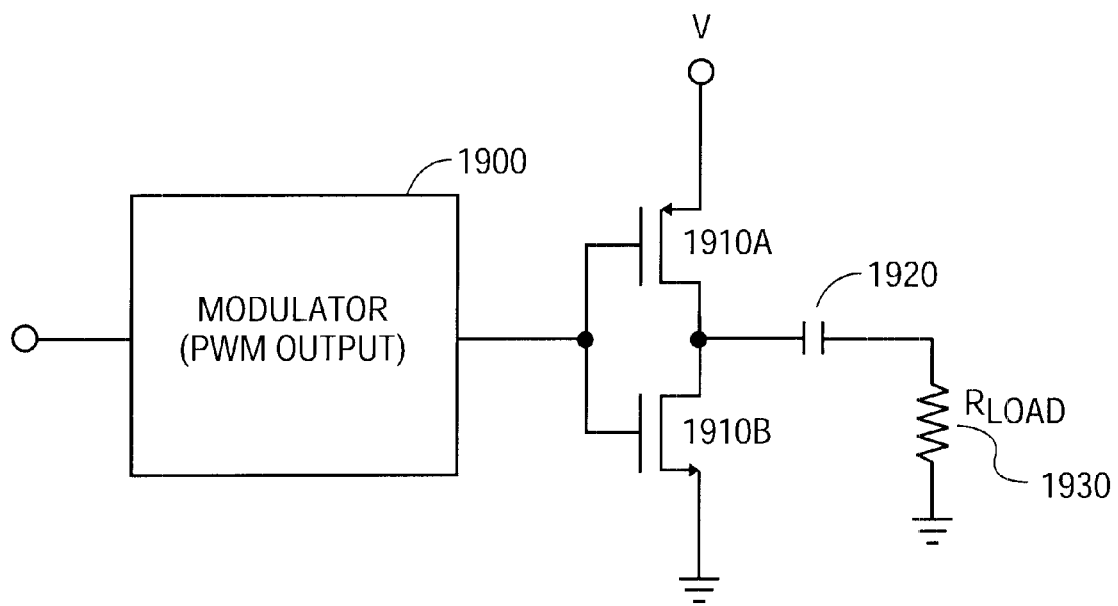
FIG. 19A is a schematic diagram of another embodiment of the invention in which a pulse-width modulated output signal is applied to an amplifier that is single-ended AC coupled to a load.
Figure 19B:
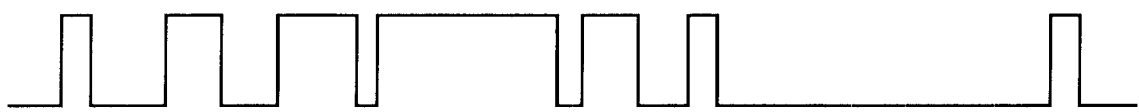
FIG. 19B illustrates an exemplary wave form output of a pulse-width modulator.

FIG. 19A is a schematic diagram of another embodiment of the invention in which the pulse-width modulator output of a modulator is applied to an amplifier that is single-ended AC coupled to a load. As shown in FIG. 19A, a modulator 1900 provides a pulse-width modulator output. A pair of switches 1910 A and 1910 B cooperates with the output of modulator 1900 to selectively connect an AC output coupling capacitor 1920 to a source voltage V or to ground. The amount of time the output of pulse-width modulator 1900 is high, i.e., "on time," determines the amount of charge on loading capacitor 1920. If a logic high pulse-width modulated signal is continuously produced by pulse-width modulator 1900, the voltage V will be applied substantially continuously to capacitor 1920. On the other hand, if a logic low pulse-width modulated signal is produced by pulse-width modulator 1900, capacitor 1920 will be coupled to ground through switch 1910 B. Intermediate percentages of on-time reflect the pulse-width modulation and permit the output capacitor 1920 to provide a signal at the load impedance $R_{load}$ 1930 which tracks the signal represented by the pulse-width modulation.

Upon start-up, applying the voltage V directly to the AC coupling capacitor would result in a large pop at the output, just as in the circuits described heretofore. This problem can be solved in this example by starting the pulse-width output at a constant logic low. By setting the input of the modulator to the corresponding value before turning the modulator on, the modulator can be begin controlling the output signal without producing an audio pop or click. If the input to the modulator is ramped from negative full-scale (e.g. 0% duty cycle) to zero (e.g. 50% duty cycle) slowly, then the output can charge the AC coupling capacitor from ground to the common mode level without causing an audible click. At this point, control of the modulator input can be turned over to the signal path.

Figure 20:
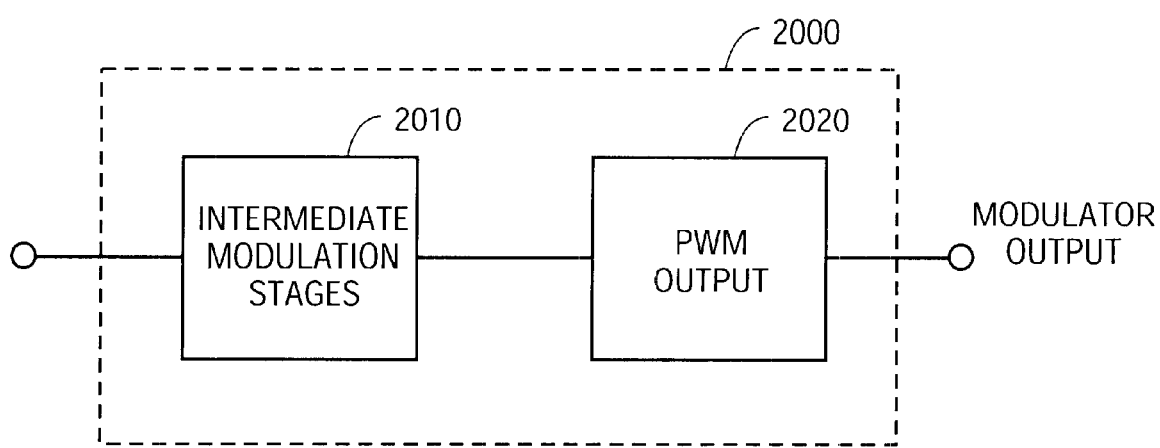
FIG. 20 illustrates an architecture suitable for implementing the modulator of FIG. 19.

This approach can be applied with particular advantage to circuits combining multi-bit delta-sigma modulators and pulse-width modulation. FIG. 20 illustrates an example of a modulator 2000 that includes intermediate modulation stages 2010 (e.g., delta-sigma modulators) and pulse-width modulator stage 2020. The aforementioned transient suppression techniques can be implemented in modulator 2000.

Figure 21:
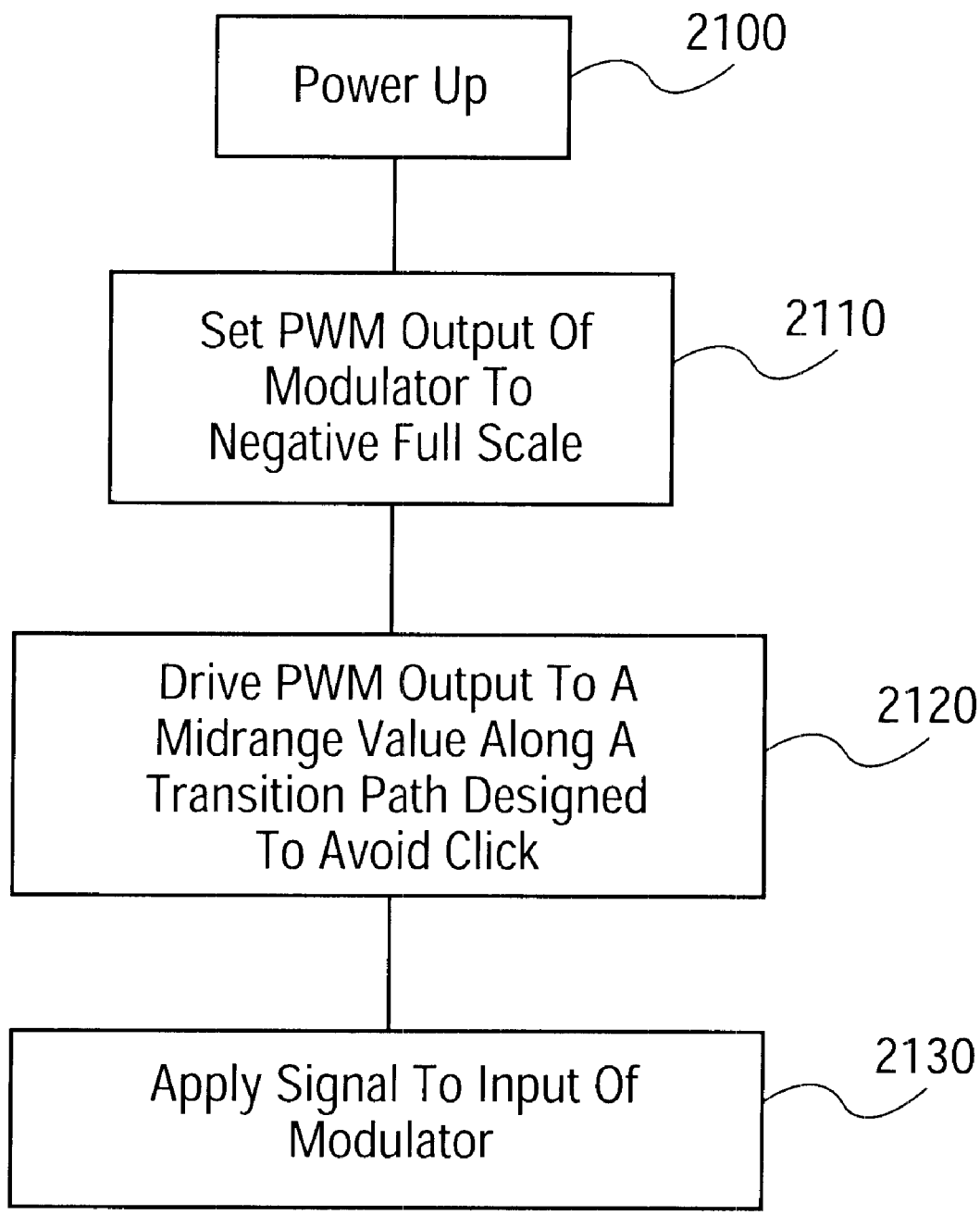
FIG. 21 is a flow chart illustrating a process by which transients are suppressed at the output of the circuits shown in FIG. 19A.

FIG. 21 is a flow chart of a process by which the modulator circuit shown in FIG. 19A can be operated to achieve the benefits of the invention described herein. Upon power-up (2100), the pulse-width modulated output of the modulator is set to a negative full scale (2110). This then matches the output signal level to the reference voltage on the other side of the coupling capacitor. The pulse-width modulated output can then be driven to a mid-range value along a transition path designed to avoid a click (2120). A transition path can be a ramp of any desired slope or a non-linear path of any shape. Setting the PWM output to the negative full-scale can be accomplished either by directly controlling the PWM output circuit 2010 (e.g., the PWM modulator) or by controlling intermediate modulation stages or the input to the modulator.

Although the present invention has been described and illustrated in detail, it is clearly understood that the same is by way of illustration and example only and is not to be taken by way of limitation, the spirit and scope of the present invention being limited only by the terms of the appended claims and their equivalents.

What is claimed is:

1. A transient suppression apparatus, comprising:
    a single-ended AC-coupled output stage driving a load;
    a pulse-width modulated driver for said single-ended output stage; and
    a control circuit for setting the output of said driver to produce an output substantially equal to a reference potential found on one side of said load and for gradually adjusting said driver to a nominal operating output thereafter.

2. The transient suppression apparatus of claim 1 in which the input to said pulse-width driver is received from a digital to analog converter.

3. The transient suppression apparatus of claim 1 in which the input to said pulse-width driver is received from a delta sigma modulator.

4. The transient suppression apparatus of claim 1 in which the control circuit gradually adjusts said driver to a nominal operating output along a transition path.

5. The transient suppression apparatus of claim 4 in which said transition path is non-linear.

6. The transient suppression apparatus of claim 1 in which said control circuit prevents signal input from being applied to said pulse-width modulated driver until said output reaches said nominal operating output.

7. The transient suppression apparatus of claim 1 in which said control circuit overrides signal input applied to said pulse-width modulated driver until said output reaches said nominal operating output.

8. A method of providing transient suppression, comprising the step of causing a pulse-width modulated circuit to produce an output substantially equal to a reference potential found on one side of a load at power up and for gradually adjusting said pulse-width modulated circuit to a nominal operating output thereafter.

9. The method of claim 8 in which the input to said pulse-width modulated circuit receives an input from a delta sigma modulator and the step of controlling comprises controlling said delta sigma modulator output.

10. The method of claim 8 in which the step of controlling adjusts said pulse-width modulated circuit from a reference potential found on one side of a load at power up and gradually to a nominal operating output along a transition path.

11. The method of claim 10 in which said transition path is non-linear.

12. The method of claim 8 in which the step of controlling prevents signal input from being applied to said pulse-width modulated circuit until said output reaches said nominal operating output.

13. The method of claim 8 in which the step of controlling overrides signal input applied to said pulse-width modulated circuit until said output reaches said nominal operating output.

14. An integrated circuit comprising:
    a single-ended AC-coupled output stage driving a load;
    a pulse-width modulated driver for said single ended output stage; and
    a control circuit for setting the output of said driver to produce an output substantially equal to a reference potential found on one side of said load and for gradually adjusting said driver to a nominal operating output thereafter.

15. The integrated circuit of claim 14 wherein the single-ended AC-coupled output stage further comprises:
  a first transistor coupled to a voltage source;
  a second transistor coupled to the between the first transistor and ground.

16. The integrated circuit of claim 15 wherein the first transistor includes a first gate electrode, the second transistor includes a second gate electrode, and the pulse-width modulated driver includes an output terminal coupled to the first gate electrode and the second gate electrode.

17. A apparatus comprising:
  a source of one or more channels of audio information;
  a digital-to-analog converter for converting digital audio information from said source into one or more channels of analog information, the digital-to-analog converter including a pulse-width modulated driver;
  a transient suppression apparatus having a control circuit for setting the output of the pulse-width modulated driver to produce an output substantially equal to a reference potential for a load and for gradually adjusting said driver to a nominal operating output thereafter; and
  an output system for producing audible representations of said one or more channels of audio information.

* * * * *